(12) United States Patent
Campbell et al.

(10) Patent No.: US 10,834,827 B2
(45) Date of Patent: Nov. 10, 2020

(54) SYSTEM FOR POTTING COMPONENTS USING A CAP

(71) Applicant: HELLA GmbH & Co. KGaA, Lippstadt (DE)

(72) Inventors: Robert Bruce Campbell, Tecumseh (CA); Steffen Hoppe, Lippstadt (DE)

(73) Assignee: HELLA GmbH & Co. KGaA, Lippstadt (DE)

( * ) Notice: Subject to any disclaimer, the term of this patent is extended or adjusted under 35 U.S.C. 154(b) by 295 days.

(21) Appl. No.: 15/704,526

(22) Filed: Sep. 14, 2017

(65) Prior Publication Data

US 2019/0082541 A1   Mar. 14, 2019

(51) Int. Cl.
  *H05K 3/28*  (2006.01)
  *B29C 70/74*  (2006.01)
  (Continued)

(52) U.S. Cl.
  CPC ....... *H05K 3/284* (2013.01); *B29C 45/14655* (2013.01); *B29C 45/14778* (2013.01);
  (Continued)

(58) Field of Classification Search
  CPC ............ H05K 3/284; H05K 5/064; H05K 2203/1311; B29C 45/1701; B29C 45/14778; B29C 45/14655; B29C 70/745; B29K 2995/0007; B29K 2995/0005; B29K 2101/12; B29L 2031/3481
  (Continued)

(56) References Cited

U.S. PATENT DOCUMENTS 4,163,072 A * 7/1979 Soos ............ H01L 21/56
                                                257/790
4,264,549 A   4/1981 Utner
(Continued)

FOREIGN PATENT DOCUMENTS

DE   202015104630 U1   12/2016
GB         1418949      12/1975
WO    2014054145 A1    4/2014

OTHER PUBLICATIONS

International Search Report and Written Opinion for related PCT Application No. PCT/IB2018/056781, dated Dec. 20, 2018, 14 pages.

*Primary Examiner* — Robert C Dye
*Assistant Examiner* — Guy F Mongelli
(74) *Attorney, Agent, or Firm* — Warner Norcross + Judd LLP

(57) ABSTRACT

A housing assembly includes a housing, a printed circuit board (PCB) contained in a housing, and a cup-shaped cap having an interior and a flange portion. A tall component extending from the PCB is covered by the cap such that the tall component is disposed in the interior of the cap and the flange portion of the cap engages the PCB. A vacuum is applied and while maintaining the vacuum, an encapsulant is introduced into the housing to a level so as to cover the PCB and certain other components not the relatively taller component(s). When the vacuum is released, a pressure differential between the environmental pressure and the vacuum remaining in the cap interior forces encapsulant into the cap interior to a level higher than that outside of the cap. A multi-level height potting process is achieved.

17 Claims, 14 Drawing Sheets

(51) Int. Cl.
- *B29C 45/14* (2006.01)
- *B29C 45/17* (2006.01)
- *H05K 5/06* (2006.01)
- *B29L 31/34* (2006.01)
- *B29K 101/12* (2006.01)

(52) U.S. Cl.
CPC ........ *B29C 45/1701* (2013.01); *B29C 70/745* (2013.01); *H05K 5/064* (2013.01); *B29K 2101/12* (2013.01); *B29K 2995/0005* (2013.01); *B29K 2995/0007* (2013.01); *B29L 2031/3481* (2013.01); *H05K 2203/1311* (2013.01)

(58) Field of Classification Search
USPC ........................................................ 264/483
See application file for complete search history.

(56) References Cited

U.S. PATENT DOCUMENTS

| | | | | |
|---|---|---|---|---|
| 5,473,814 A * | 12/1995 | White | ................... | H01L 21/563 29/840 |
| 5,554,821 A * | 9/1996 | Patterson | ............... | H05K 3/284 174/541 |
| 5,997,798 A * | 12/1999 | Tetreault | ................ | B29C 33/10 264/272.14 |
| 6,046,076 A | 4/2000 | Mitchell et al. | | |
| 6,117,382 A * | 9/2000 | Thummel | ......... | B29C 45/14655 257/E21.504 |
| 6,399,178 B1 * | 6/2002 | Chung | .................... | H01R 4/04 428/131 |
| 8,821,778 B2 | 9/2014 | Kraus | | |
| 9,254,588 B1 * | 2/2016 | Chao | ................... | H05K 3/0047 |
| 9,936,580 B1 * | 4/2018 | Vinciarelli | .......... | B23K 1/0016 |
| 2001/0033478 A1 * | 10/2001 | Ortiz | ................. | H01R 13/6599 361/818 |
| 2001/0035299 A1 * | 11/2001 | Achari | .................... | H05K 3/44 174/255 |
| 2002/0031672 A1 * | 3/2002 | Eguchi | .................... | H01L 23/24 428/447 |
| 2002/0097562 A1 * | 7/2002 | Moriya | .................... | C25D 5/10 361/728 |
| 2002/0137257 A1 * | 9/2002 | Huang | .................. | H01L 21/561 438/107 |
| 2002/0162679 A1 * | 11/2002 | Hannan | ................ | H01L 21/563 174/528 |
| 2004/0245674 A1 * | 12/2004 | Yew | ....................... | H05K 3/284 264/272.17 |
| 2007/0049121 A1 | 3/2007 | Steele | | |
| 2010/0094245 A1 * | 4/2010 | Py | ............................. | A61J 1/05 604/415 |
| 2011/0090658 A1 * | 4/2011 | Adams | .................... | H01L 23/57 361/765 |
| 2012/0086135 A1 * | 4/2012 | Thompson | .............. | H01L 23/13 257/787 |
| 2013/0094151 A1 * | 4/2013 | Escamilla | .............. | H05K 5/065 361/714 |
| 2013/0286609 A1 | 10/2013 | Merz | | |
| 2014/0160363 A1 * | 6/2014 | Mutschelknaus | ..... | G09F 27/008 348/799 |
| 2014/0327624 A1 * | 11/2014 | Srinivas | ................ | G06F 1/1626 345/173 |
| 2014/0340904 A1 * | 11/2014 | Biermann | ............. | G01J 1/0492 362/267 |
| 2015/0077961 A1 * | 3/2015 | Thiesen | ................... | H05K 9/00 361/765 |
| 2015/0249043 A1 * | 9/2015 | Elian | .................. | H01L 21/4867 257/684 |
| 2016/0007482 A1 * | 1/2016 | Schonholz | ................ | B32B 5/26 156/275.5 |
| 2016/0299261 A1 * | 10/2016 | Harris | ................... | G02B 1/14 |
| 2016/0374223 A1 | 12/2016 | Xu et al. | | |
| 2017/0014934 A1 * | 1/2017 | Borneman | .......... | H05K 7/1432 |
| 2017/0172439 A1 * | 6/2017 | Zhu | ........................ | B32B 15/06 |

\* cited by examiner

SYSTEM FOR POTTING COMPONENTS USING A CAP

CROSS-REFERENCE TO RELATED APPLICATIONS

Not applicable.

BACKGROUND a. Technical Field

The instant disclosures relates to a system for encapsulating components with a potting material (i.e., potting process), and more particularly, to a system for encapsulating components using a cap.

b. Background Art

This background description is set forth below for the purpose of providing context only. Therefore, any aspects of this background description, to the extent that it does not otherwise qualify as prior art, is neither expressly nor impliedly admitted as prior art against the instant disclosure.

It is known to encapsulate a printed circuit board (PCB), including electrical and/or electronic components thereof, with an encapsulant such as a potting material or the like. The reason for potting is to protect the PCB and its components against a variety of potentially harsh environmental factors that the PCB/components may encounter during its service life.

The PCB is typically located in a housing. To completely encapsulate the components for protection, the potting height is normally chosen so as to cover all the components mounted to the PCB. Thus, the "tallest" component will determine the minimum potting height, even if "shorter" components in other areas of the PCB would otherwise require a lesser potting height. It can be appreciated, however, that the foregoing approach results in a potting material depth in certain areas of the PCB that is greater than is needed. While it may be possible to provide different potting levels according to different component heights, multi-level potting height approaches are generally complex, expensive, and in some cases technically risky.

The foregoing discussion is intended only to illustrate the present field and should not be taken as a disavowal of claim scope.

SUMMARY

In an embodiment, a method for encapsulating a component in a housing assembly is provided. The method involves providing a housing assembly that includes a housing with an opening and a printed circuit board (PCB) disposed in the housing, wherein the PCB includes at least one component positioned with respect to the PCB and wherein the PCB has a surface. The at least one component extends a distance away from the PCB surface. The method further involves installing a cap over the component wherein the cap includes an interior defined by a wall such that the component is disposed in the interior of the cap. The method still further involves (after installing the cap) applying predetermined vacuum to the housing assembly, and then after applying the vacuum, introducing an encapsulant through the opening of the housing so as to fill the housing to a predetermined potting level, wherein a portion of the interior of the cup remains at a pressure level established by the vacuum.

The method still further involves releasing the vacuum to thereby subject the housing assembly to an atmospheric pressure, wherein a pressure differential between the atmospheric pressure and the remainder vacuum in the interior of the cap causes encapsulant to flow from the housing into the interior of the cap to thereby encapsulate at least a portion of the component. The method also involves curing the encapsulant.

The foregoing and other aspects, features, details, utilities, and advantages of the present disclosure will be apparent from reading the following description and claims, and from reviewing the accompanying drawings.

DETAILED DESCRIPTION

Figure 1:
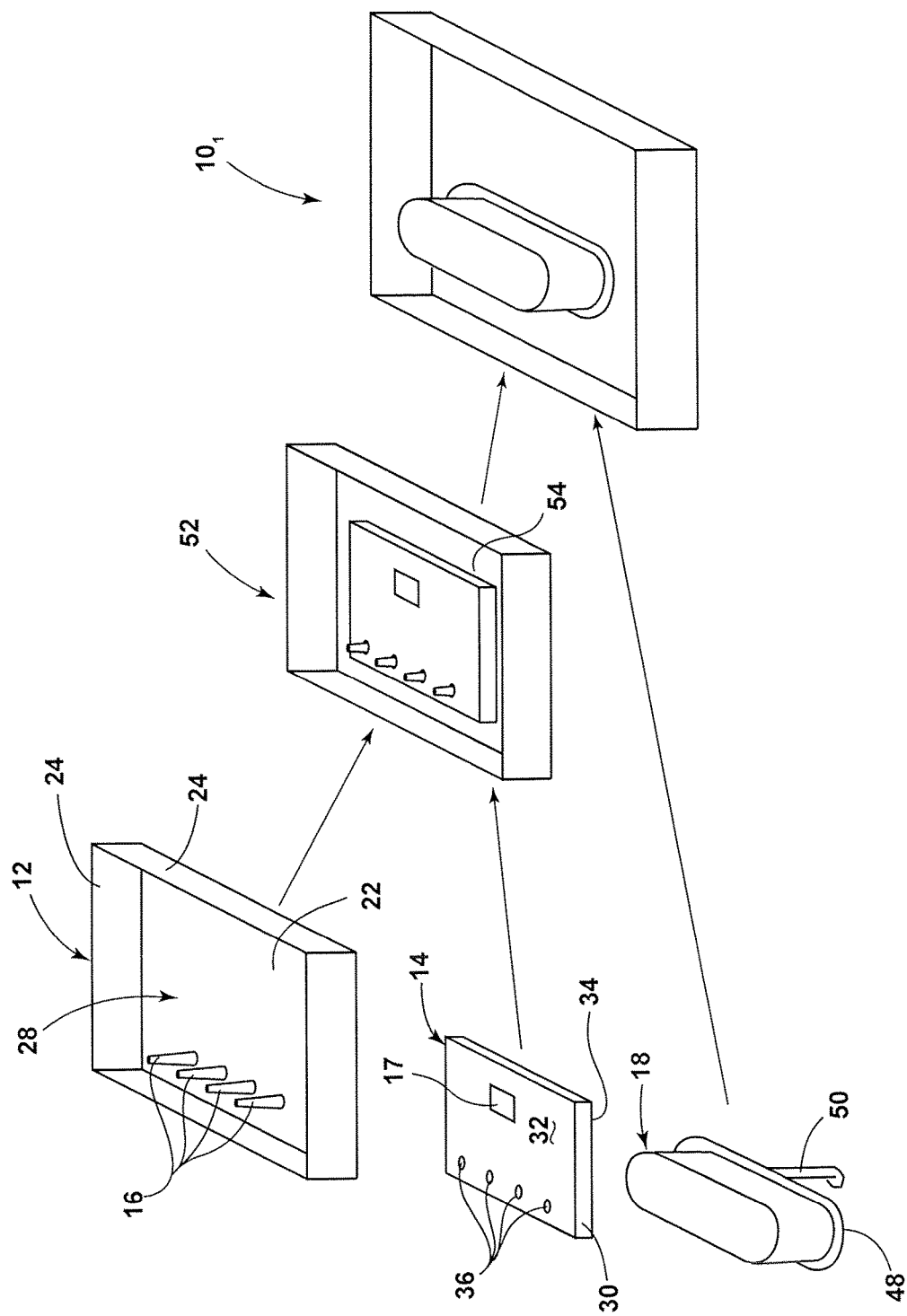
FIG. 1 is a diagrammatic view showing a housing assembly including a housing, a printed circuit board (PCB), a component, and a cap, for a first stage of processing (i.e., an initial assembly stage).

Various embodiments are described herein to various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments, the scope of which is defined solely by the appended claims.

Reference throughout the specification to "various embodiments," "some embodiments," "one embodiment," or "an embodiment," or the like, means that a particular feature, structure, or characteristic described in connection with the embodiment is included in at least one embodiment. Thus, appearances of the phrases "in various embodiments," "in some embodiments," "in one embodiment," or "in an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment may be combined, in whole or in part, with the features, structures, or characteristics of one or more other embodiments without limitation given that such combination is not illogical or non-functional. It should also be appreciated that for conciseness and clarity, spatial terms such as "vertical," "horizontal," "up," and "down" may be used herein with respect to the illustrated embodiments.

Before proceeding to a detailed description of a system and method for encapsulation, a general overview will first be described. Generally, in embodiments, the height of the potting level may be chosen based on functionality and material savings reasons rather than based on the height of the tallest component. For example, the height of the potting level may be selected to be lower than the height of the tallest component. To protect a component(s) that rise higher than this predetermined potting level, a cap is applied to cover such component(s) before introducing the encapsulant (e.g., potting material). Generally, then, before the encapsulant is introduced, the housing containing the component(s) to be covered with the cap is subjected to a vacuum. In an embodiment, an optional plasma treatment step (or other adhesion supporting treatment/step) can be used before applying the vacuum to improve the adhesion of the later-added encapsulant to contacted surfaces. This vacuum evacuates the interior of the cap and establishes the interior of the cap at a pressure level of the vacuum. Then, the encapsulant is introduced into the housing, which covers the PCB as well as the bottom of the cap. Thereafter, and while the encapsulant remains fluid, the vacuum is released.

A pressure differential is created between the environmental pressure level (e.g., atmospheric pressure) and the vacuum in the interior of the cap (i.e., established at the pressure of the vacuum). This pressure differential will urge the fluid encapsulant into (i.e., "up") the interior of the cap and fill a certain volume of the cap interior. Other spaces/volumes previously subject to the vacuum will also experience this pressure differential and the encapsulant will be also urged into such spaces/volumes. It should be noted the pressure differential is sufficient to urge encapsulant into the cap interior even as against gravity. Other aspects, features, details, utilities, and advantages will be apparent from reading the following description and claims, and from reviewing the accompanying drawings.

Referring now to the drawings wherein like reference numerals are used to identify identical or similar components in the various views, FIG. 1 is a diagrammatic view showing, in a first stage of processing, a housing assembly $10_1$ including a housing 12, a printed circuit board (PCB) 14, a component 16, and a cap 18. The housing assembly $10_1$ will herein refer to the housing assembly 10 in a first stage, which means the where the PCB has been inserted into the housing and the cap installed but before any further processing stages such as plasma treatment, potting, and curing.

The housing 12, while shown in a square-shaped form for simplicity sake only, may take a wide variety of shapes and materials (e.g., engineering plastics) known in the art. As illustrated, the housing may include integral electrical components such as one or more electrical terminals 16 (e.g., insert molded), which may provide an electrically-conductive interface between an external connector (not shown) and the PCB 14. As shown, the housing 12 may include a base wall 22 that extends into a plurality of side walls 24 that collectively define a housing volume. The housing 12 may also include other features, such as for example only, risers 26 (best shown in FIG. 8), although it should be understood that in alternate embodiments, the PCB 14 may include legs (not shown) or the like configured to accomplish a similar function of dimensional offset. The housing 12 further includes an opening 28 opposite the base wall 22 and through which the PCB 14 and cap 18 are inserted, as well as through which the encapsulant 20 is introduced. The housing 12 may be made of various materials known in the art for such applications, including but not limited to thermoplastics, thermosets, metals, and the like. The housing 12 can be molded, machined or stamped. The terminals 16 may be insert molded, stitched into the housing after molding or used within a separate connector assembly.

The PCB 14 may comprise conventional materials and construction approaches known in the art and may include one or more electrical and/or electronic component(s) mounted thereto—designated by reference numeral 17—such as resistors, capacitors, inductors, semiconductor chips such as application specific integrated circuits (ASIC), relays, and other electrical components known in the art. In the illustrated embodiment, the PCB 14 includes a main body 30 which may include an electrically-insulative substrate on which is formed one or more separate layers on and through which electrical connections (e.g., through electrically-conductive traces) with and between the components 17 are formed. The PCB 14 includes a upper surface 32 and an opposing lower surface 34.

As also shown in FIG. 1, the PCB 14 also includes a plurality of through-going holes 36 through which the terminals 16 are positioned when the PCB 14 is disposed in the housing 12. The through-going holes 36 may include electrically-conductive material to engage the electrically-conductive terminals 16. In other words, in the illustrated embodiment, the terminals 16 disposed in holes 36 electrically connect by way of a mechanical/electrical connection.

Figure 3:
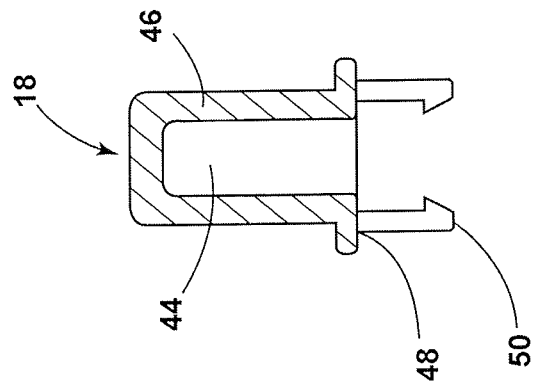
FIG. 3 is a cross-sectional view of the cap of FIG. 1.
Figure 2:
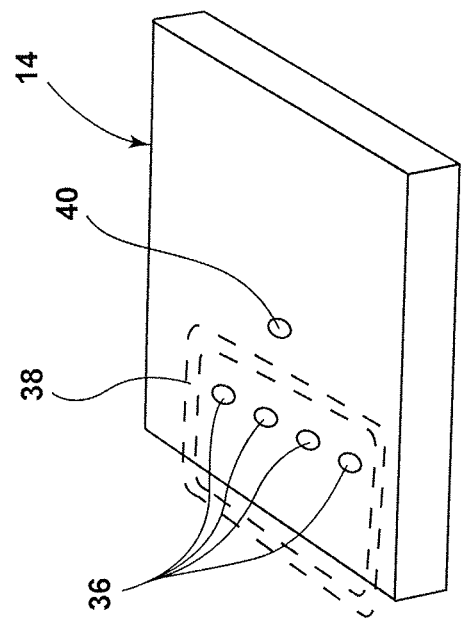
FIG. 2 shows the PCB of FIG. 1 in greater detail including an encapsulant flow hole.

FIG. 2 shows the PCB 14 in greater detail while FIG. 3 is a cross-sectional view of the cap 18. The PCB 14 includes a contact area 38 that corresponds to the footprint of the flange portion 48 of the cap 18. The cap 18 is installed on the PCB 14 by positioning the flange portion 48 relative to the PCB 14 so that the flange portion 48 engages the contact area 38. A hole 40 is provided for attaching the cap 18 and is configured to receive a protrusion (e.g., leg 50) of the cap 18 (see below). As will be described below, the cap 18 may include snap legs 50 that go on an edge of the PCB 14 and through the hole 40 to connect the cap 18 to the PCB 14 before the potting process. Other means of attaching the cap 18 to the PCB 14 can be used, however, for example only, screwing the cap 18 to the PCB 14.

The PCB 14 may include, in an embodiment, at least one through-going hole 40 extending from the upper surface to the lower surface, as described above. The hole 40 is located outwardly of the contact area 38, in an embodiment. The hole 40 is configured primarily to receive a snap leg 50 but it should be understood that hole 40 may allow some encapsulant to flow through the PCB 14. In an embodiment, a portion of the cap 18 extends beyond the edge of the PCB 14, facilitating the flow of encapsulant into the interior 44. Alternatively and/or additionally, the cap 18 and/or PCB 14 are formed in such a way that the cap 14 does not seal tightly to the PCB 14 thereby allowing a pathway (i.e., between the flange portion 48 and the upper surface of the PCB 14) through which encapsulant may flow to reach the interior 44 of the cap 14. A hermetic seal is made by the encapsulant once it has cured. In an embodiment, the cap 18 may comprise thermoplastic resin but can be made from any material that the encapsulant will bond to during the curing process.

FIG. 3 shows the cap 18 in cross-section, which comprises, in an embodiment, a generally cup-shaped body that includes an interior 44 defined by a substantially continuous wall 46 that extends into a flange portion 48. The cup 18 may further include a protrusion 50 or the like configured to couple the cap 18 to the PCB 14. In the illustrated embodiment, the cap 18 is configured in size and shape to cover and substantially surround the terminals 16, as will be described below. The cap 18 may comprise conventional materials sufficient to withstand the below-described plasma treating, vacuum (i.e., withstand pressure differential), potting, and curing stages. In an (optional) embodiment, the cap 18 may comprise optically transparent materials so as to allow optical monitoring of the potting process and/or quality confirmation afterwards, either through machine vision or via operator observation. In such an embodiment, the encapsulant may comprise a color (i.e., not optically transparent) to allow a potting level to be more definitively distinguished. In other words, an optically-transparent cap 14 allows for an optical control of the encapsulation process (e.g., control the introduction of encapsulant in order to achieve a predetermined potting level).

Referring again to FIG. 1, a sub-assembly 52 is formed by disposing the PCB 14 in the housing 12 so that the terminals 16 reside in the holes 36. A dimensional clearance 54 is reserved between an edge of the PCB 14 and an inside surface of sidewall 24, which allows the encapsulant 20 to flow past and under the PCB 14. After the PCB 14 has been situated in the housing 12, the cap 18 is installed onto the PCB 14 to cover the subject component(s), namely, the terminals 16, which reside and are disposed in the interior 44 of the cap 18. The cap 18 is installed on the PCB 14 by positioning the flange portion 48 relative to the PCB 14 so that the flange portion 48 engages the contact area 38. In an embodiment, the cap 14 remains part of the housing assembly 10. The housing assembly 10, is thus formed at this first stage of processing.

Alternatively (to using hole 40) and/or additionally, the cap 18 and/or PCB 14 are formed in such a way that the cap 18 does not seal tightly to the PCB 14 (i.e., hermetically) thereby allowing a pathway to be formed between the underside of the flange portion 48 and the upper surface of the PCB 14. Encapsulant may flow through this pathway to reach the interior 44 of the cap 14. It should be understood that in this latter embodiment, the pathway may be provided in addition to or in substitution of through-going hole 40.

Figure 4:
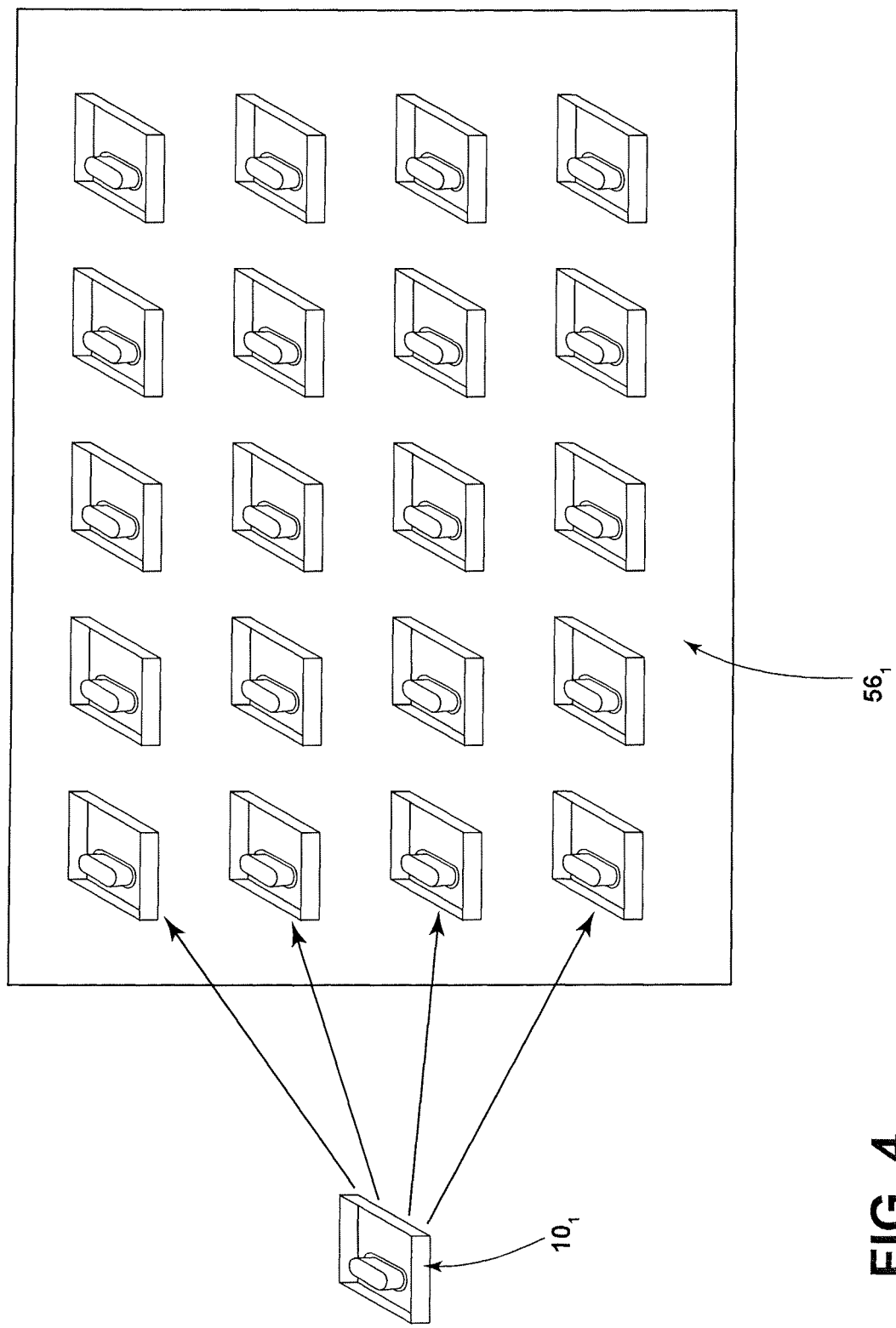
FIG. 4 is a diagrammatic view of a plurality of housing assemblies of FIG. 1 loaded onto a pallet for further processing.

FIG. 4 is a diagrammatic view of a plurality of housing assemblies $10_1$ as disposed on a pallet 56. It should be understood, however, that the present teachings do not require that a plurality of housing assemblies $10_1$ be processed simultaneously.

Figure 5A:
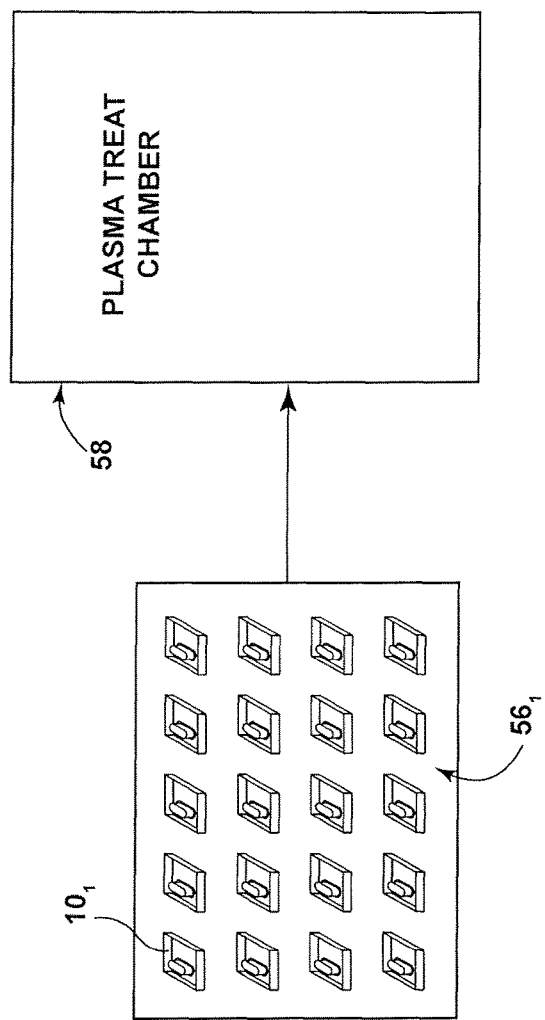
FIG. 5A is a diagrammatic view of the loaded pallet of FIG. 4 being moved to a plasma treating chamber for a second stage of processing.

FIG. 5A is a diagrammatic view of the loaded pallet $56_1$ being moved to a plasma treating chamber 58 for a second stage of processing. Generally speaking, the plasma treatment process is configured to prepare the surface of all components to allow for improved adhesion of the encapsulant after potting. In particular, plasma treatment may comprise of a flow of ions that places a small charge onto the surface of the components making the surface molecules "stand up" allowing better adhesion of the surface and the encapsulant. In the illustrated embodiment, the chamber 58 is provided for such plasma treatment and utilizes a low pressure plasma system. Such a plasma treatment system/chamber may comprise commercially available systems, for example only, from PINK GmbH Thermosysteme, Wertheim, Germany. It should be understood that other adhesion supporting treatment/steps can be used instead of or in addition to the plasma treating step to improve the adhesion of the later-added encapsulant to contacted surfaces.

Figure 5B:
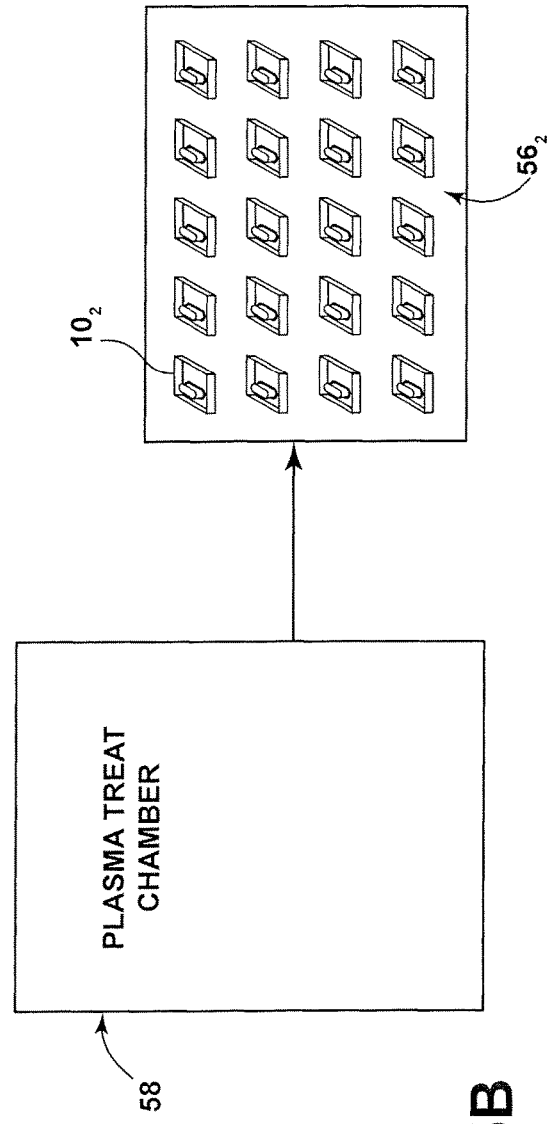
FIG. 5B is a diagrammatic view of pallet of housing assemblies of FIG. 4 exiting the plasma treating chamber.

FIG. 5B is a diagrammatic view of a pallet $56_2$ of now plasma-treated housing assemblies $10_2$ exiting the plasma treating chamber 58.

Figure 6:
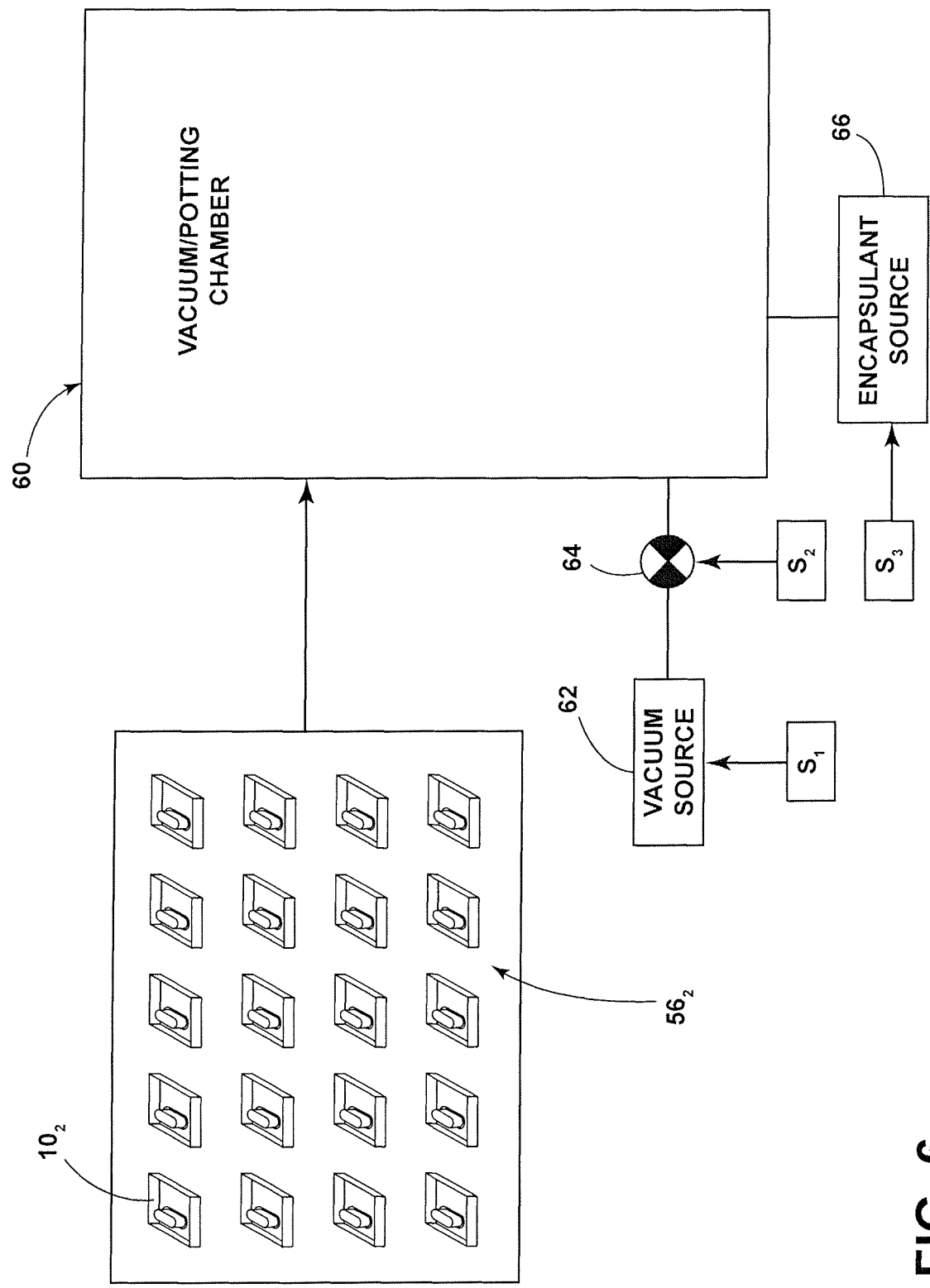
FIG. 6 is a diagrammatic view of the pallet of plasma-treated housing assemblies of FIG. 5B being moved to a vacuum/potting chamber for a third stage of processing.

FIG. 6 is a diagrammatic view of the pallet $56_2$ of plasma-treated housing assemblies $10_2$ being moved to a vacuum/potting chamber 60 for a third stage of processing. In an embodiment, a vacuum source 62 may be coupled to the interior of the chamber 60 by way of a controlled valve 64. An electronic control unit (ECU—not shown) may be configured to control the process and may be configured to generate a first control signal $S_1$ to activate and deactivate the vacuum source 62 and a second control signal $S_2$ to open or close valve 64. In an embodiment, the vacuum level applied to the interior of the chamber 60 may be between about 5-10 millibars, although it should be understood that variations are possible based in part on the type of encapsulant 20 being used (e.g., viscosity), the geometry and volume of the interior 44 of the cap 18, the geometry and size of passages and/or cap/PCB pathway described above and other factors.

FIG. 6 further shows an encapsulant source 66 which may be controlled to begin and end the flow of encapsulant 20 into the respective housing assemblies $10_2$ in accordance with a further, third control signal $S_3$ generated by the above-described ECU. In an embodiment, encapsulant 20 may comprise but not limited to polyurethane material and epoxy resins.

It should be understood that the depiction of the vacuum source 62/valve 64 and/or encapsulant source 66 as separate items is for purposes of description only and not limiting in nature—these components may be integrated directly into the vacuum/potting chamber 60 and/or may be under manual control, in an embodiment.

With continued reference to FIG. 6, at this stage of the processing, a predetermined vacuum level, relative to the environmental pressure outside the chamber (e.g., atmospheric pressure level), is applied to the interior of the chamber 60. The process proceeds to the next stage of the potting process (FIG. 7), namely, introducing the encapsulant 20.

Figure 7:
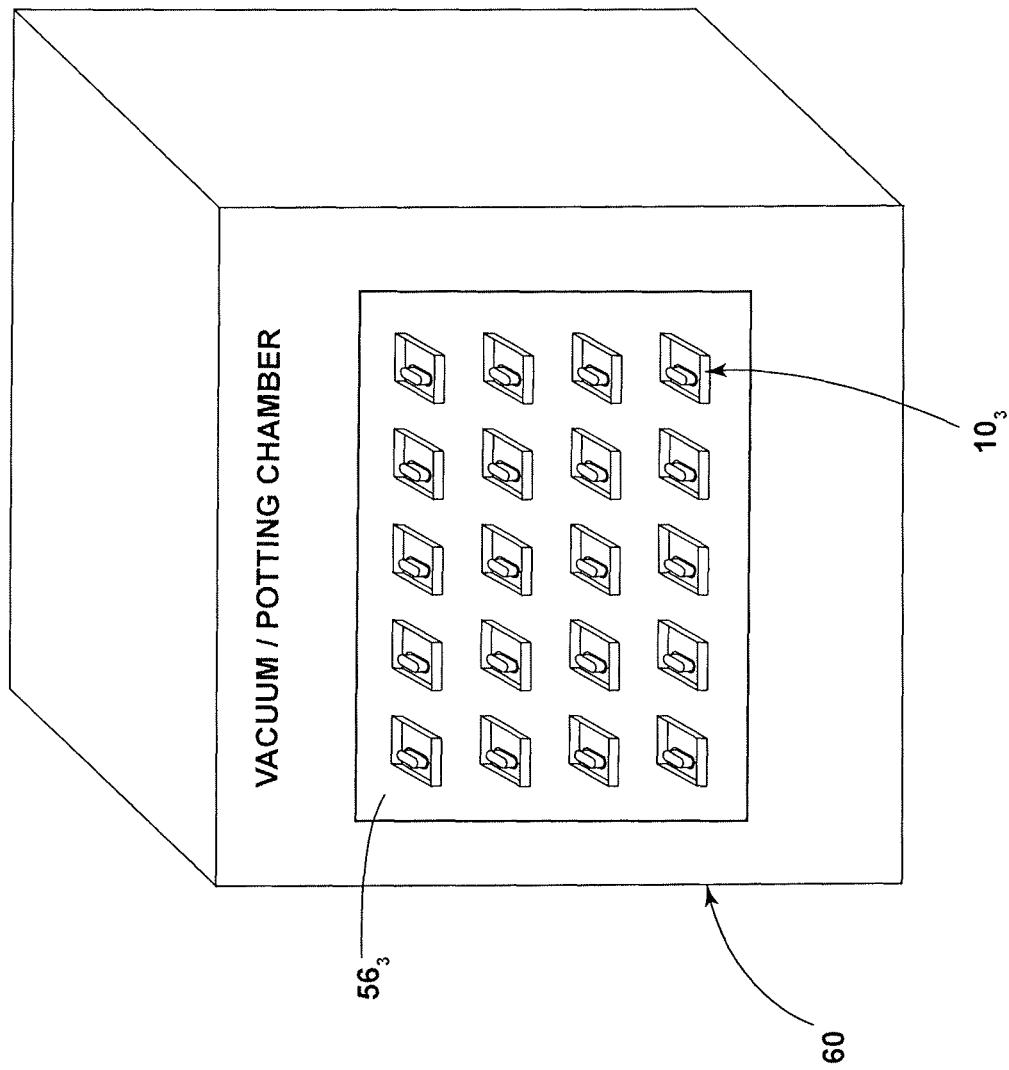
FIG. 7 is a diagrammatic view of a pallet of housing assemblies in the vacuum/potting chamber where vacuum has been applied and an encapsulant has been introduced.

FIG. 7 is a diagrammatic view of a pallet $56_3$ of the housing assemblies $10_3$ disposed in the vacuum/potting chamber 60. The depiction in FIG. 7 is after the predetermined vacuum has been applied and is also after the step of introducing the encapsulant 20 into each of the housing assemblies. It should be understood that, in an embodiment, the cap is hermetically closed while the vacuum is being applied, which ensures that the interior volume is properly evacuated. It should be understood that the cap 18 is sealed by the encapsulant 20 while under vacuum and after the vacuum is released leaving a vacuum in the interior 44 of the cap 18. This vacuum in the interior needs to be maintained until the encapsulant is cured so as to not allow any "air" into the cap interior that could expand/contract with changes in temperature.

Figure 8:
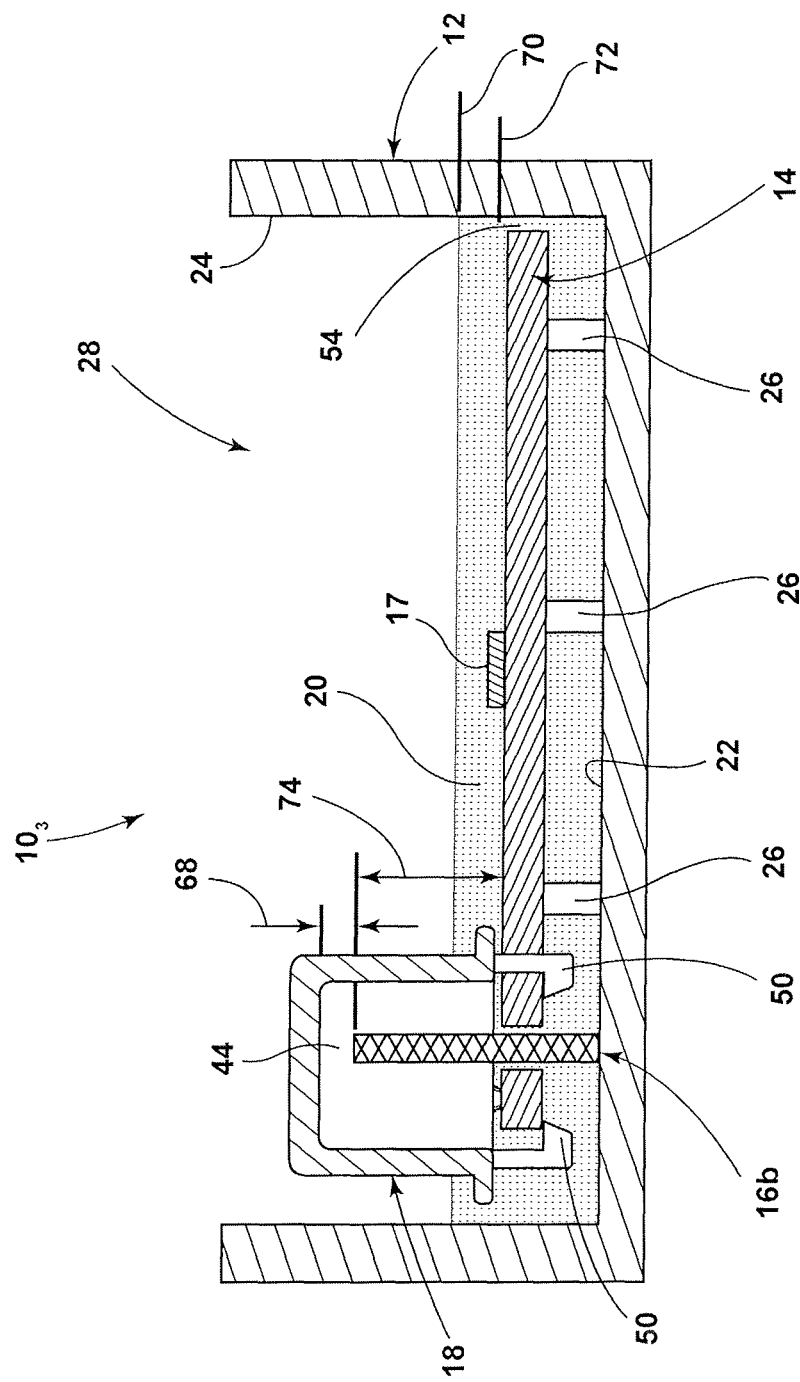
FIG. 8 is a diagrammatic, cross-sectional view of a housing assembly from FIG. 7 with vacuum applied and encapsulant introduced.

FIG. 8 is a diagrammatic, cross-sectional view of the housing assembly $10_3$ of FIG. 7. The cap 18 may be configured to cover the terminal(s) 16 and the cap has a height that extends a distance 68 above the top of the terminal(s) 16. In the illustrated embodiment, the cap 18 can also be situated relative to the PCB 14 and terminals 16 so that at least a part of the interior 44 of the cap 18 overhangs the edge of the PCB 14. The headroom (i.e., height of cap relative to the height of the terminal) influences the volume of the interior 44 of the cap 18 and also ensures that the cap has sufficient height to allow the pressure differential to draw the encapsulant up into the interior, thereby covering at least a portion of the terminal 16. Additionally, in an embodiment, the encapsulant 20 may be selected so that it will cure without outgassing. In an alternate embodiment, however, where the encapsulant may be expected to outgas, the interior volume 44 in the cap 18 must be selected (adjusted upwards) so as to account for this additional outgassing volume. Also, the PCB 14 may be offset or otherwise spaced apart from the base wall 22 by one or more risers 26 and spaced apart and away from at least one of the sidewalls 24 in order to create the above-described clearance 54.

After applying the vacuum, the encapsulant 20 is introduced through the top opening 28 of the housing 12 so as to fill the housing 12 to a predetermined potting level 70 taken with respect to a reference level 72 defined by the upper surface 34 of the PCB 14. The encapsulant can flow through the clearance 54 to reach the volume between the base wall of the housing and the bottom surface 34 of the PCB 14 and fill this volume. The predetermined potting level 70 may be sufficient to cover most of the components on the PCB 14 but may be less than that needed to completely cover the "tallest" component, for example, the terminal(s) 16.

As illustrated, the terminal(s) 16 extend a distance 74 away from the upper surface 32 of the PCB 14. The predetermined potting level 70 is configured to completely cover selected components, such as component 17 mounted to PCB 14. The predetermined potting level 70, however, is selected so as to be less than the distance 74 such that the terminal(s) 16 will not become completely covered with encapsulant 20. This approach reduces the total amount of encapsulant needed as well as satisfies other functional requirements (e.g., satisfies a maximum curing time which may be difficult to meet with relatively thick encapsulant coverage). It should be understood, however, that the initial volume of encapsulant introduced into the housing 12 must be sufficient to account for a subsequent stage of processing where an additional volume of encapsulant fills at least a portion of the interior 44 of the cap 18. The initial volume must therefore be sufficiently large so that even after a reduction of volume due to the interior cap fill, that the other regions outside of the cap 18 will still enjoy an adequate thickness to cover the other components 17 to a specified level. After the encapsulant 20 has been introduced into the housing 12, at least a portion of the cap interior 44 will remain at the pressure level set by the vacuum. The processing then proceeds to the next stage (FIG. 9).

Figure 9:
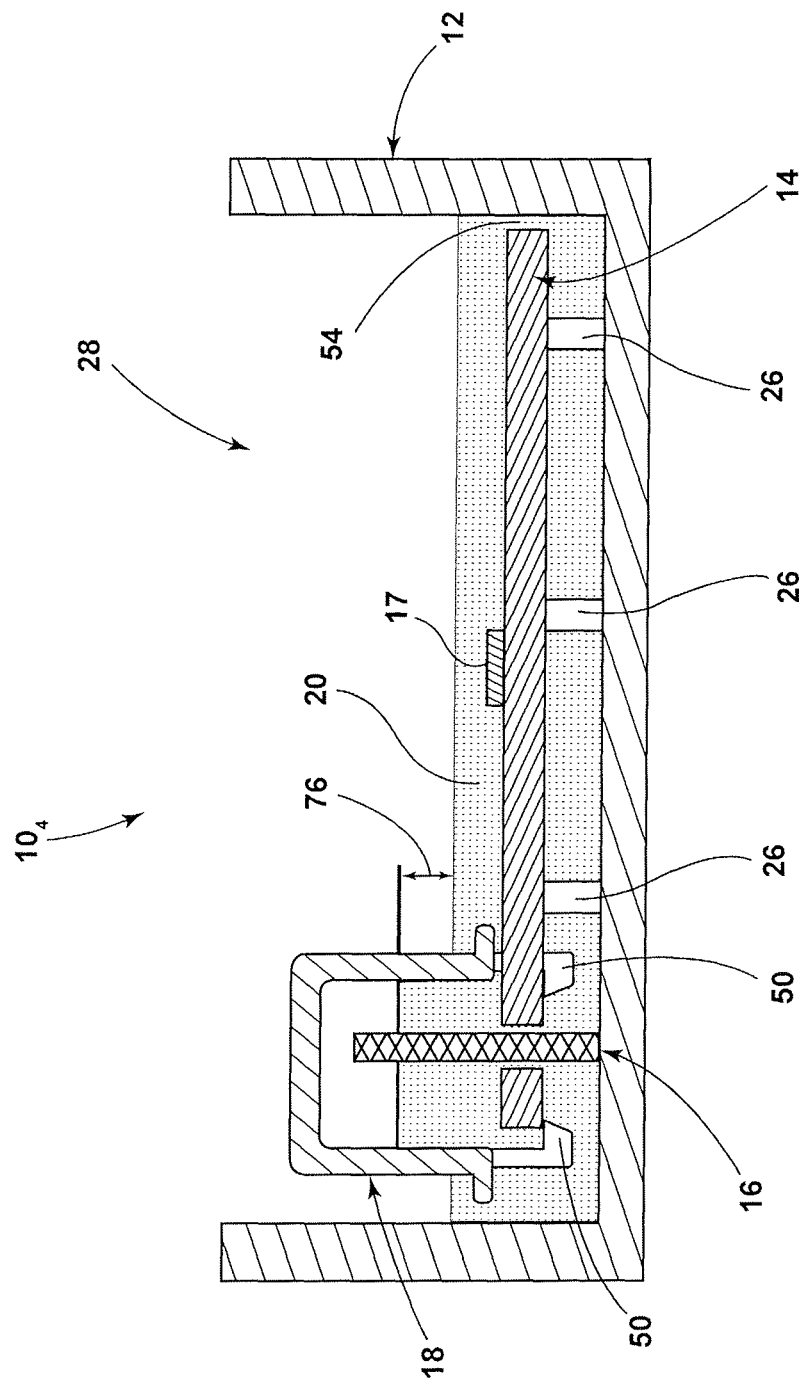
FIG. 9 is a diagrammatic, cross-sectional view of the housing assembly of FIG. 8 with the vacuum released (fourth stage of processing) showing encapsulant flowing up into the interior of the cap.

FIG. 9 is a diagrammatic, cross-sectional view of a housing assembly $10_4$ with the vacuum released and showing the encapsulant flowing up into the cap interior. After releasing the vacuum, the housing assembly is subjected to an environmental pressure level (e.g., pressure level outside the cap), which may be an atmospheric pressure level. A pressure differential is formed between the environmental pressure level, on the one hand, and the lower vacuum pressure level that remains in the cap interior, on the other hand. The pressure differential causes the encapsulant to flow generally from the housing 12 into the interior 44 of the cap 18 to thereby cover or otherwise encapsulate at least a predetermined portion of the component (e.g., terminal 16). For example, the encapsulant may flow through the through-going hole 40 into the cap interior. As shown, the housing assembly $10_4$, in this further stage of processing, reflects a multi-level potting process where the potting level inside the interior of the cap 18 is higher by a distance 76 compared to the main potting level 70 for the other components (e.g., component 17). In other words, a first encapsulant level in the interior of the cap 18, relative to the upper surface of the PCB, is higher (i.e., by distance 76) than a second, encapsulant level (i.e., level 70—FIG. 8) outside of the cap 18. In the illustrative embodiment, only a portion of the cap interior volume may be filled with encapsulant 20. The remaining unfilled volume that resides above level 76 may be determined by the quality of the vacuum, the viscosity of the encapsulant, and the time to fill the cap volume (interior) and the ongoing curing of the encapsulant.

FIGS. 10-13 illustrate a further embodiment of the cap 18, designated by reference numeral 18a. It should be understood that the cap 18a is generally similar to cap 18, and in the FIGS. 10-13 like reference numerals are used but which include the suffix "a" to identify like features.

Figure 10:
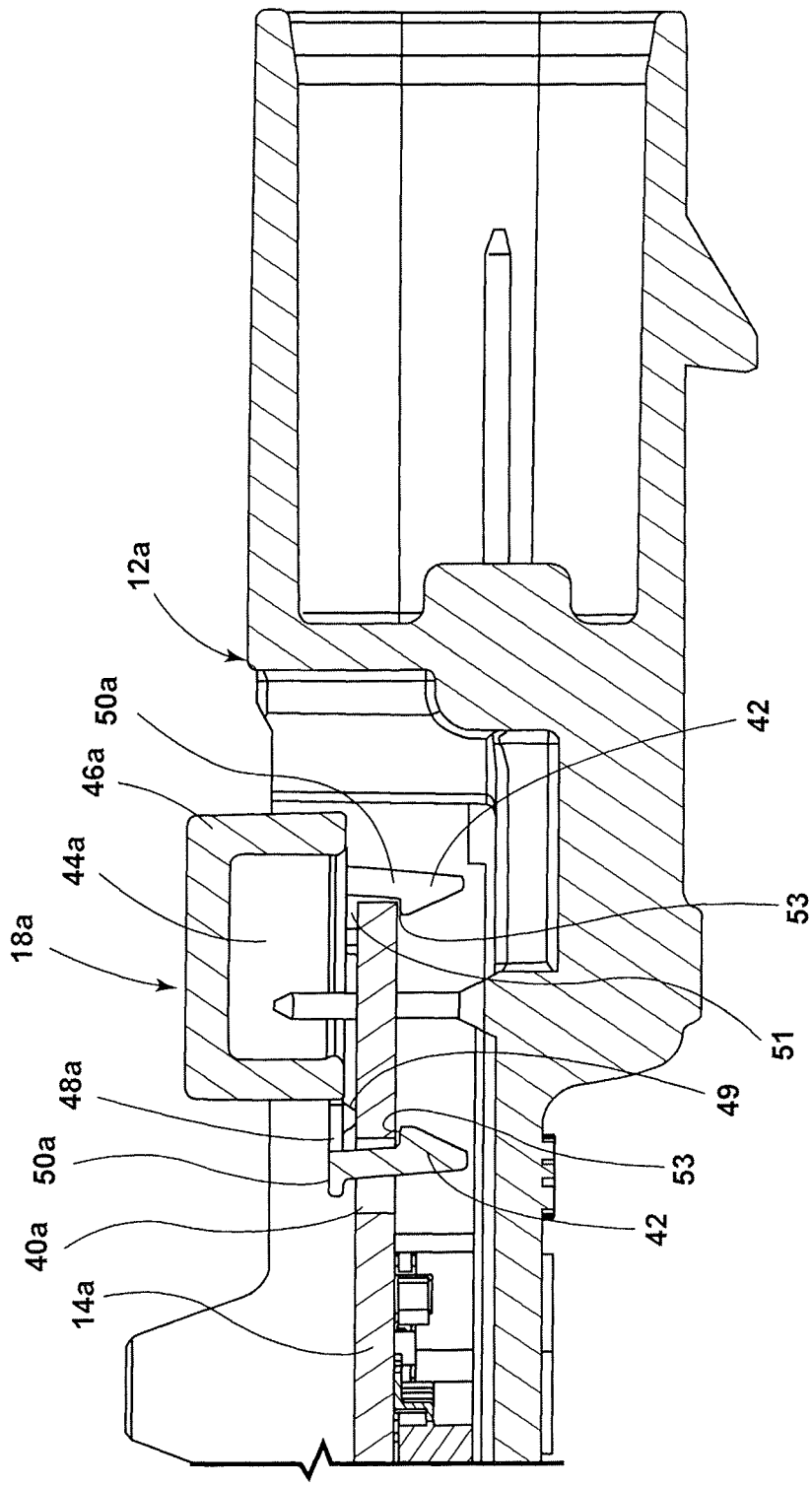
FIG. 10 is a simplified, cross-sectional side view of a housing assembly including a further cap embodiment attached to a PCB before encapsulant has been introduced.

FIG. 10 is a simplified, cross-sectional side view of the cap 18a as attached to a PCB 14a before encapsulant 20 has been introduced into the housing 12a. The cap 18a includes a rib 49 extending axially downwardly from the bottom-most surface of a flange 48a. In an embodiment, the rib 49 may not be continuous around the perimeter of the flange 48a but rather presents as plural rib segments separated by intervening slots which define gaps 51 when the cap 18a is attached to the PCB 14a. The gaps 51 are configured to allow the encapsulant to flow therethrough (between the flange 48a and the PCB 14a) and enter the cap interior 44a.

In addition, the cap 18a includes at least one, and in the illustrated embodiment, multiple snap legs 50a extending axially away from the flange 48a, generally downwardly in the orientation of FIG. 10. The snap legs 50a are configured to attach the cap 18a to the PCB. While it is possible to remove the cap 18a from the PCB 14a by flexing snap legs 50a outwardly to release the lock, it is contemplated that the cap 18a will remain part of the housing assembly post-potting. One of the illustrated snap legs 50a may be disposed in a through-hole 40a while the other snap legs 50a may be positioned outboard of the PCB 14a.

Each leg 50a includes a respective foot 42 having a lip 53. The lip 53 is configured to catch on the bottom surface of the PCB 14a—thereby retaining the cap 18a attached to the PCB 14*a*. It should be further appreciated that the legs 50*a* are not necessarily in an opposed relationship with each other (e.g., 9 O'clock and 3 O'clock) and may assume other positions. Additionally, the cap 18*a* is configured in size and shape and is positioned relative to the PCB 14*a* such that at least a portion of the interior 44*a* overhangs the edge of the PCB 14*a*, thereby providing a further opening/passageway for the inflow of encapsulant 20 into the cap interior 44*a*.

Figure 11:
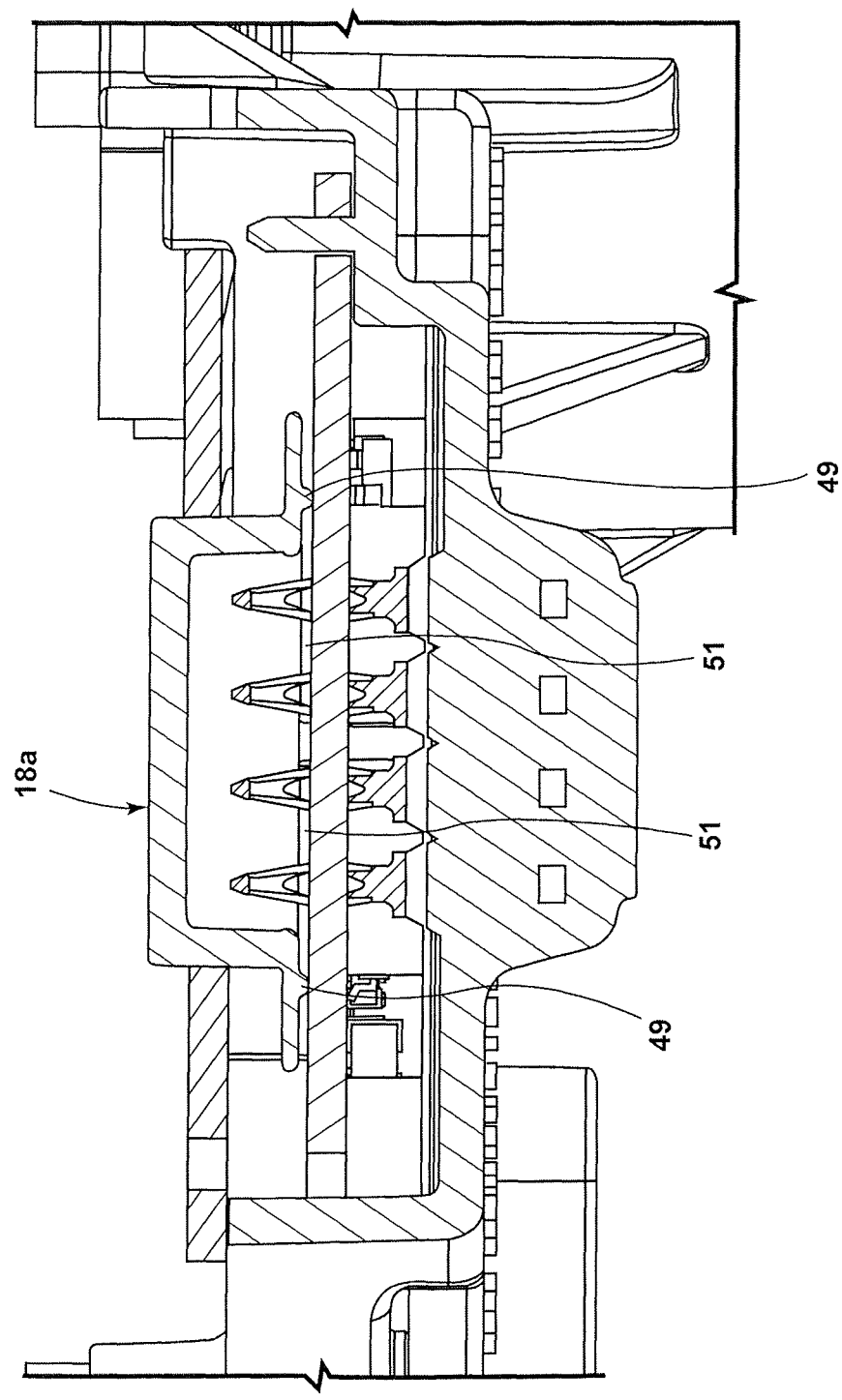
FIG. 11 is a simplified, cross-sectional front view of the housing assembly of FIG. 10.

FIG. 11 is a simplified, cross-sectional front view of the cap 18*a* as attached to the PCB 14*a* before encapsulant 20 has been introduced into the housing 12*a*. The rib segments 49 of the cap 18*a* are shown which create gaps 51.

Figure 12:
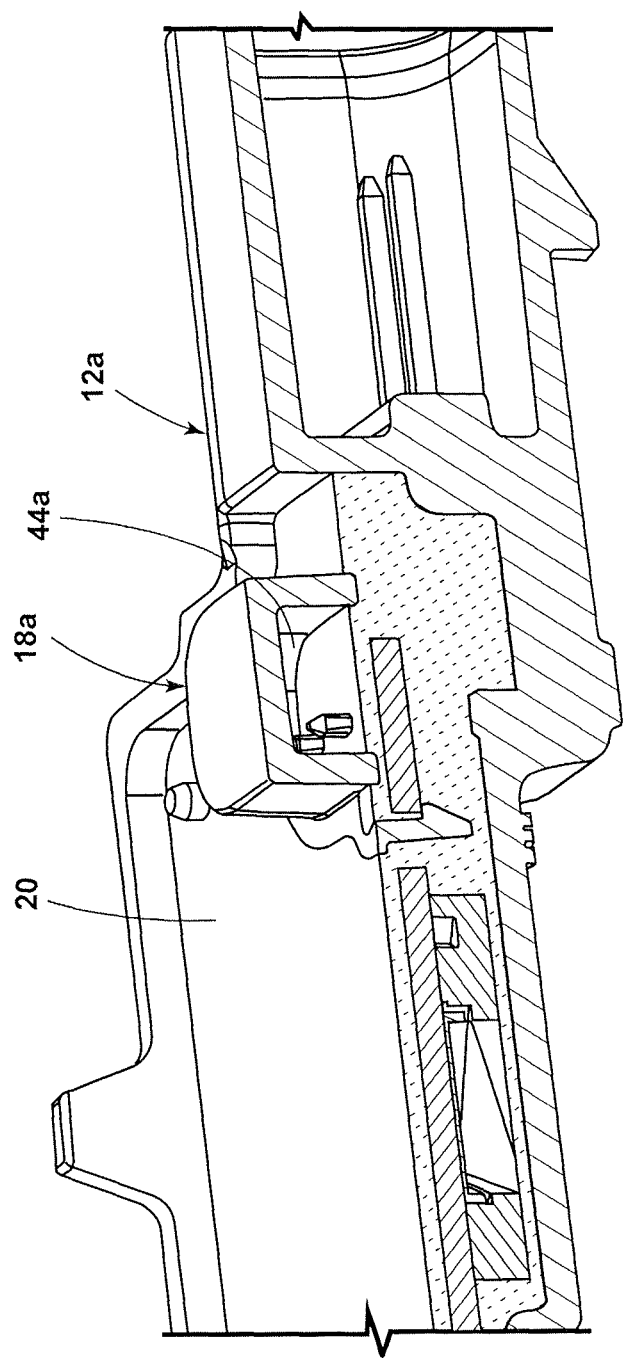
FIG. 12 is a simplified isometric view of the housing assembly of FIGS. 10-11, after introduction of an encapsulant into the housing and before the vacuum is released.

FIG. 12 is an isometric view of the cap 18*a* of FIGS. 10-11 after the encapsulant 20 has been introduced into the housing 12*a*. As shown, the encapsulant 20, while the vacuum is maintained, finds a certain level above the upper surface of the PCB 14*a* outside the cup interior but this level is shown as approximately the same level in the cup interior 44*a*.

Figure 13:
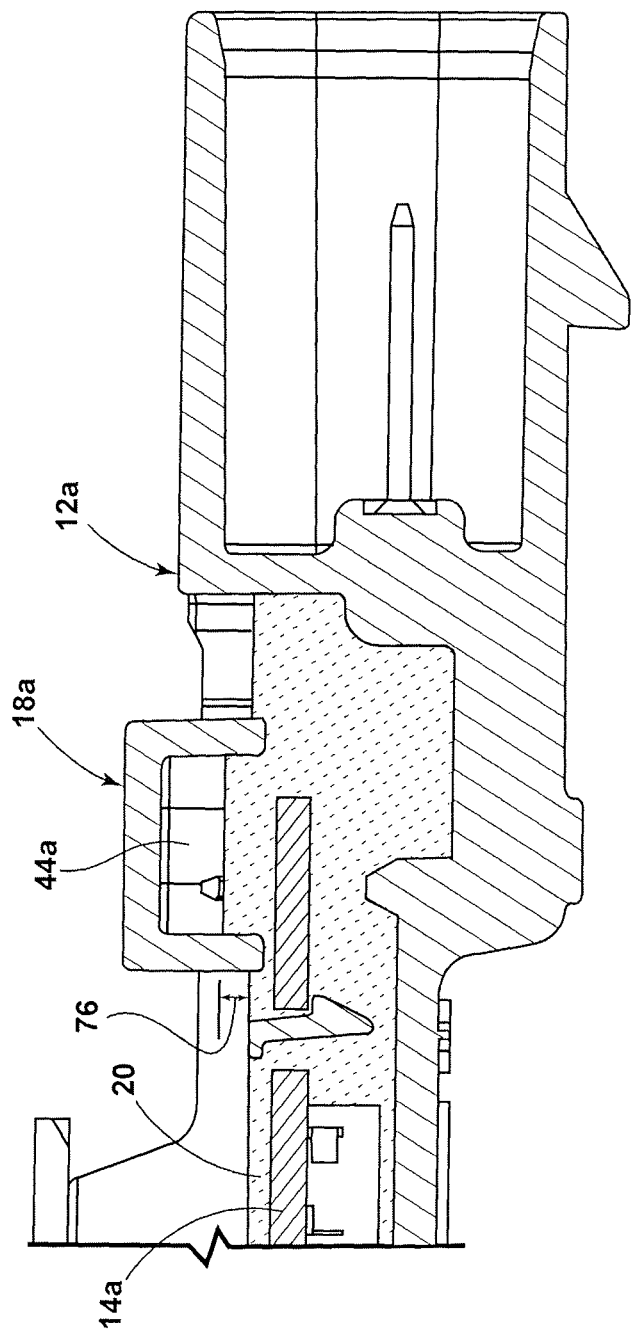
FIG. 13 is a simplified cross-sectional view of the potted housing assembly of FIG. 12 after the vacuum has been released.

FIG. 13 is a simplified, cross-sectional side view of FIG. 10 after the encapsulant 20 has been introduced and after the vacuum has been released. Like in the embodiment of FIG. 9, a first encapsulant level in the cap interior 44*a*, relative to the upper surface of the PCB 14*a*, is higher (i.e., by a distance 76) than a second encapsulant level outside of the cap 18*a* (i.e., multi-level).

Figure 14:
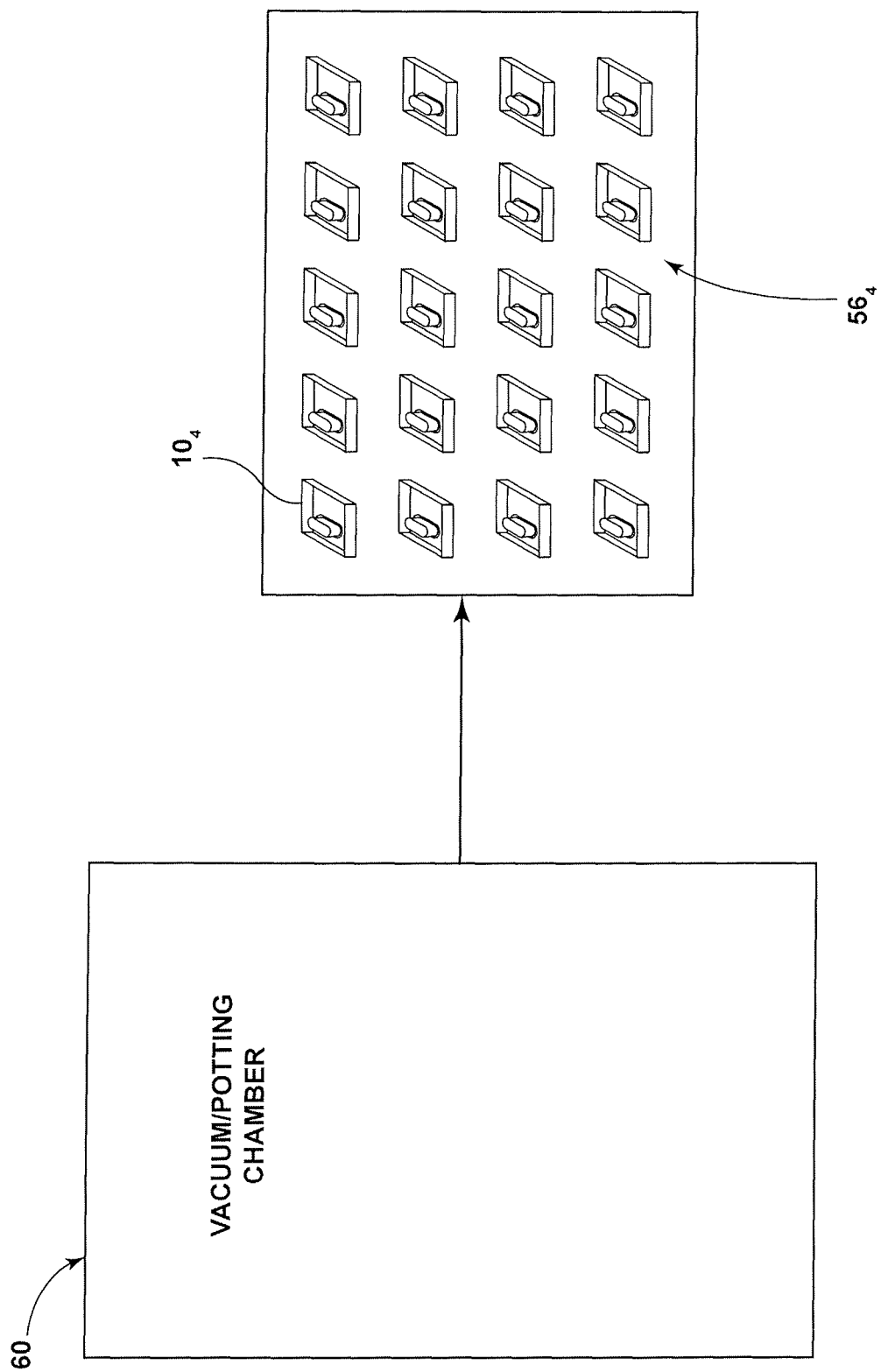
FIG. 14 is a diagrammatic view of a pallet of potted housing assemblies exiting the vacuum/potting chamber destined for a curing oven in a further stage of processing.

FIG. 14 is a diagrammatic view of a pallet of potted housing assemblies 10$_4$ exiting the vacuum/potting chamber 60. After a suitable set-up time, the potted assemblies 10$_4$ are moved out of the chamber 60. In an embodiment, the time must be sufficient to allow the encapsulant 20 to reach a balance due to the atmospheric pressure and would depend on the viscosity of the encapsulant used.

Figure 15:
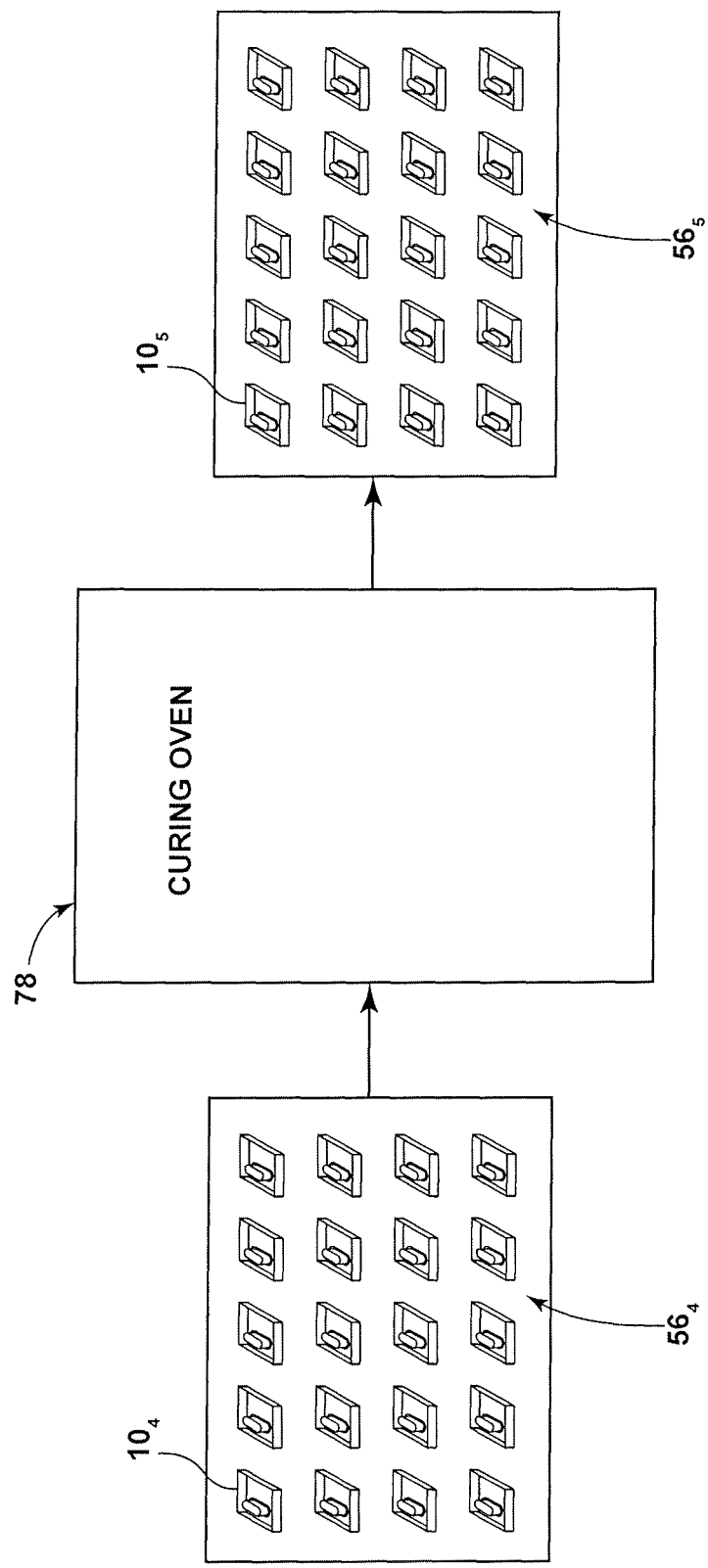
FIG. 15 is a diagrammatic view of the pallet of potted housing assemblies of FIG. 10 entering and exiting a curing oven, in a still further stage of processing.

FIG. 15 is a diagrammatic view of the pallet of housing assemblies 10$_4$ (see FIG. 14) being moved to a curing oven 78, in a further stage of processing. The potted housing assemblies 10$_4$ are heated in the curing oven 78 according to a predetermined heating profile as a function of time. The final housing assemblies 10$_5$ are then moved out of the curing oven. The curing process is encapsulant material specific and may include the use of a heating oven or an array of UV lights used to irradiate the encapsulant with ultraviolet (UV) light. The particulars are understood by those in the art to depend on at least the type of encapsulant 20 being used. In an embodiment, a curing process (e.g., temperature profile versus time or irradiation with UV light) may be as specified by the manufacturer of the encapsulant 20.

The foregoing numerous embodiment solve one or more problems known in the art. A reduced amount of encapsulant can be used and still achieve a multi-level potting height. Embodiments consistent with the present teachings also do not incur increased processing times (cycle times) that would otherwise be needed in order to pot and cure relatively thick areas of encapsulant, especially where such relatively thick areas are unnecessarily to cover many of the components.

Although only certain embodiments have been described above with a certain degree of particularity, those skilled in the art could make numerous alterations to the disclosed embodiments without departing from the scope of this disclosure. For example only, the present teachings may be applied to protect mechanical components instead of or in addition to electrical and/or electronic components.

All directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. Additionally, the terms "electrically connected" and "in communication" are meant to be construed broadly to encompass both wired and wireless connections and communications. It is intended that all matter contained in the above description or shown in the accompanying drawings shall be interpreted as illustrative only and not limiting. Changes in detail or structure may be made without departing from the invention as defined in the appended claims.

Any patent, publication, or other disclosure material, in whole or in part, that is said to be incorporated by reference herein is incorporated herein only to the extent that the incorporated materials does not conflict with existing definitions, statements, or other disclosure material set forth in this disclosure. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

While one or more particular embodiments have been shown and described, it will be understood by those of skill in the art that various changes and modifications can be made without departing from the spirit and scope of the present teachings.

What is claimed is:

1. A method for encapsulating at least one component in a housing assembly, comprising:
   providing a housing assembly that includes a housing with an opening and a printed circuit board (PCB) disposed in the housing, wherein the PCB includes the at least one component positioned with respect to the PCB and wherein the PCB has a surface, the at least one component including an upper portion extending a distance away from the surface of the PCB;
   installing a cap over the at least one component, wherein the cap includes an interior defined by a wall and a cover, the at least one component being disposed in the interior of the cap;
   after installing the cap, applying a predetermined vacuum to the housing assembly;
   after applying the vacuum, introducing an encapsulant through the opening of the housing so as to fill the housing to a predetermined potting level, wherein a portion of the interior of the cap remains at a pressure level established by the vacuum;
   releasing the vacuum to subject the housing assembly to atmospheric pressure, wherein a pressure differential between atmospheric pressure and a remainder vacuum in the interior of the cap causes encapsulant to flow from the housing upwardly into the interior of the cap to encapsulate the upper portion of the at least one component while a level of encapsulant outside the cap simultaneously decreases; and
   curing the encapsulant.

2. The method of claim 1 further comprising selecting the predetermined potting level so as to be less than the distance to which the upper portion of the at least one component extends from the surface of the PCB.

3. The method of claim 1 wherein after releasing the vacuum, a first encapsulant level in the interior of the cap, relative to the PCB surface, is higher than a second encapsulant level outside of the cap.

4. The method of claim 1 wherein the wall includes a flange portion configured to engage the PCB surface, and wherein installing the cap further comprises positioning the cap relative to the PCB so that the flange portion of the cap engages a contact area on the surface of the PCB whereby the at least one component is disposed in the interior of the cap.

5. The method of claim 4 wherein providing the housing assembly further comprises forming the housing with a base wall that extends to a sidewall and offsetting the PCB from the base wall and at least a portion of the sidewall so as to define a clearance.

6. The method of claim 5 wherein the cap includes at least a snap leg for attaching the cap to the PCB, and wherein the surface of the PCB is an upper surface, said PCB further including a lower surface opposite of the upper surface, and wherein providing the housing assembly further comprises forming a hole through the PCB from the upper surface to the lower surface, the hole being located outwardly of the contact area, the hole being configured to receive the snap leg.

7. The method of claim 5 wherein the cap is positioned relative to the PCB so that the flange portion of the cap engages the contact area of the PCB so as to form a pathway to allow encapsulant to flow therethrough to the interior of the cap.

8. The method of claim 4 wherein the flange portion of the cap engaging the contact area of the PCB forms a hermetic seal.

9. The method of claim 1 wherein providing the housing assembly further comprises forming the cap of optically transparent material.

10. The method of claim 1 wherein after installing the cap and before introducing the encapsulant, plasma treating the housing assembly.

11. The method of claim 10 wherein after plasma treating the housing assembly, further comprising moving the housing assembly to a vacuum and potting chamber.

12. The method of claim 11 wherein curing the encapsulant comprises moving the housing assembly to a cure oven and heating the potted housing assembly according to a predetermined temperature and time strategy.

13. The method of claim 11 wherein curing the encapsulant comprises irradiating the encapsulant with ultraviolet (UV) light.

14. The method of claim 10 wherein installing the cap is performed by situating the cap over the at least one component wherein the interior of the cap overhangs an edge of the PCB thereby allowing a flow for encapsulant.

15. A method of manufacturing a printed circuit board (PCB), the method comprising:
  providing a PCB housing that defines an internal volume;
  positioning a circuit board within the internal volume, the circuit board including an upward-facing surface and an electrical component extending upwardly therefrom;
  inverting a cap over the electrical component, the cap defining an interior, wherein the cap overlies the electrical component and a portion of the circuit board;
  introducing an encapsulant into the PCB housing while the housing is subject to a vacuum to fill the housing and the cap with encapsulant to a predetermined level;
  releasing the vacuum within the PCB housing, wherein releasing the vacuum within the PCB housing causes encapsulant to flow from outside the cap to the interior of the cap and extend over the electrical component due to a retained vacuum therein, such that a level of encapsulant within the interior of the cap increases and a level of encapsulant outside the cap simultaneously decreases; and
  curing the encapsulant.

16. The method of claim 15 wherein the cap includes a wall and a cover, the cover being spaced apart from the upward-facing surface of the circuit board.

17. The method of claim 16 wherein the wall includes a flange portion that engages the upward-facing surface of the circuit board.

* * * * *